US006889369B1

(12) United States Patent
Clifton et al.

(10) Patent No.: US 6,889,369 B1
(45) Date of Patent: May 3, 2005

(54) METHOD AND APPARATUS FOR DETERMINING CRITICAL TIMING PATH SENSITIVITIES OF MACROS IN A SEMICONDUCTOR DEVICE

(75) Inventors: Terence M. Clifton, Santa Clara, CA (US); Patrick F. O'Connell, II, San Jose, CA (US); Spencer A. Petersen, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 538 days.

(21) Appl. No.: 09/915,792

(22) Filed: Jul. 26, 2001

(51) Int. Cl.$^7$ .............................. G06F 17/50; G06F 9/45
(52) U.S. Cl. ................................. 716/6; 716/4
(58) Field of Search ...................... 716/4, 5, 6; 703/19

(56) References Cited

U.S. PATENT DOCUMENTS

| | | | | |
|---|---|---|---|---|
| 5,608,645 | A | * 3/1997 | Spyrou ........................... | 716/6 |
| 5,774,367 | A | * 6/1998 | Reyes et al. .................... | 716/2 |
| 5,821,786 | A | * 10/1998 | Nozuyama et al. .......... | 327/141 |
| 5,923,564 | A | * 7/1999 | Jones, Jr. ....................... | 716/6 |
| 5,964,884 | A | * 10/1999 | Partovi et al. ................ | 713/503 |
| 6,071,003 | A | * 6/2000 | Ashuri et al. ................. | 716/6 |
| 6,327,686 | B1 | * 12/2001 | Grundmann et al. ........ | 714/738 |
| 6,383,822 | B1 | * 5/2002 | Sprayberry et al. ........... | 438/11 |
| 2003/0188271 | A1 | * 10/2003 | Zhuang et al. ................. | 716/2 |

* cited by examiner

Primary Examiner—Leigh M. Garbowski
Assistant Examiner—Magid Y Dimyan
(74) Attorney, Agent, or Firm—Williams, Morgan & Amerson (57) ABSTRACT

A method for determining critical timing path sensitivities of macros in a semiconductor device includes configuring a timing parameter of a particular macro in the semiconductor device; determining a first maximum operating frequency of the semiconductor device configured in accordance with the timing parameter; changing the timing parameter of the particular macro; determining a second maximum operating frequency of the semiconductor device configured in accordance with the changed timing parameter; and determining a contribution of the selected macro to a critical timing path of the semiconductor device based on the first and second maximum operating frequencies. A system for testing a semiconductor device having a plurality of macros includes a tester and a controller. The tester is adapted to configure a timing parameter of a particular macro in the semiconductor device, determine a first maximum operating frequency of the semiconductor device configured in accordance with the timing parameter, change the timing parameter of the particular macro, and determine a second maximum operating frequency of the semiconductor device configured in accordance with the changed timing parameter. The controller is adapted to receive the first and second maximum operating frequencies and determine a contribution of the selected macro to a critical timing path of the semiconductor device based on the first and second maximum operating frequencies.

19 Claims, 5 Drawing Sheets

METHOD AND APPARATUS FOR DETERMINING CRITICAL TIMING PATH SENSITIVITIES OF MACROS IN A SEMICONDUCTOR DEVICE

BACKGROUND OF THE INVENTION

1. Field of the Invention

This invention relates generally to semiconductor device design and testing and, more particularly, to a method and apparatus for determining critical timing path sensitivities of macros in a semiconductor device.

2. Description of the Related Art

Integrated circuit architectures are continually evolving to improve and extend the capabilities of systems, such as computer systems powered by microprocessors. Execution speed, power consumption, and circuit size are aspects of microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core. The execution speed of microprocessors is heavily analyzed and compared using various tests.

Integrated circuit devices, such as microprocessors, include a plurality of submodules (i.e., commonly referred to as macros) on a single semiconductor chip, or die, that cooperate to perform the functions of the device. Designing a microprocessor circuit typically involves modeling the functions of the macros with a software simulation and determining timing parameters for the macros. Logic races are conditions that occur in situations where logic gates are enabled by signals received from a clocked device. Problems may occur in a synchronous device if a clock edge is received too early, or if the edge is too late. The availability or stability of the data signals may not coincide with the clock edge.

During the design process of the integrated circuit, the arrangements of the macros, the performance resulting from the layout, and other design effects are difficult to anticipate. Therefore, a designer has difficulty ascertaining how aggressively to set device dimensions that determine the timing characteristics in a synchronous system. If the timing is set too aggressively, logic races may result, since logic race conditions are generally avoided by delaying clock signals with respect to data. However, if the timing is not sufficiently aggressive, the integrated circuit speed performance may be compromised.

One technique for adjusting the critical timing edges of macros within an integrated circuit is the use of self-timed pulse control (STPC) circuits to change the timing of supplied clock signals. An exemplary STPC system is described in U.S. Pat. No. 5,964,884, entitled, "Self-timed pulse control circuit," and incorporated herein by reference in it entirety. In general an STPC circuit provides a variable amount of delay in the path traversed by the clock signal that is supplied to a macro. In one example, six alternate clock paths may be provided, with each path having a varying delay characteristic. The specific number of paths depend on the particular macro and the granularity of the control desired.

During the design of an integrated circuit, the timing relationships between the macros are typically modeled using a global interconnect analysis. Based on the interconnect analysis, the particular clock path for each macro is selected (i.e., referred to as the zero path or zero STPC setting). Paths that are faster than the zero path are said to have a negative STPC offset, and paths that are slower than the zero path are said to have a positive STPC offset. Typically, once the zero paths are selected, the default timing for the macros may not be changed without a design review. Certain integrated circuits, such as microprocessors, have dedicated test modes where various settings, including STPC settings, can be manipulated for judging the performance characteristics and stability of the device. Industry standards related to such testing modes have been promulgated by the Joint Test Access Group (JTAG) consortium. Hence, the dedicated testing mode is commonly referred to as a JTAG mode. An integrated circuit testing system is used to drive the pins of the microprocessor for changing various JTAG settings and for running test operations.

Typically, a microprocessor is placed in a JTAG mode when the tester drives a series of signals having a predetermined timing relationship on the signal pins. Each vendor of a microprocessor may have its own particular pattern for entering JTAG mode, and the number and types of settings that may be altered may also vary. The microprocessor has a plurality of JTAG registers. The particular values written into these registers determines the changes to the operating parameters of the microprocessor.

One particular setting that may be changed in the JTAG mode is the STPC settings for the various macros. One type of test that may be performed by changing the STPC settings is a margin test. The STPC settings are varied about the zero setting to determine if the device still operates correctly and efficiently at the rated clock frequency. It was noticed that some microprocessors that passed tests at the default zero STPC settings had stability problems after being run in an actual system environment. STPC margin tests revealed that, even though the devices with the higher failure rates passed the zero STPC test, their stability was compromised when the STPC settings were varied. The operating characteristics of any integrated circuit vary over time and based on the operating environment (e.g., temperature, humidity, etc.) Presumably, changes to the operating characteristics, albeit slight, could alter the operation of the device such that the timing relationships defined by the default STPC settings were not sufficient to avoid race conditions.

Due to the large number of macros in some integrated circuit devices, it is difficult to determine which of the individual macros have the potential for adversely affecting the operation of the device due to timing instabilities. Hence, it is difficult to direct the efforts of design engineers to optimize the timing of the devices and improve those macros that are susceptible to timing instabilities.

The present invention is directed to overcoming, or at least reducing the effects of, one or more of the problems set forth above.

SUMMARY OF THE INVENTION

One aspect of the present invention is seen in a method for determining critical timing path sensitivities of macros in a semiconductor device. The method includes configuring a timing parameter of a particular macro in the semiconductor device; determining a first maximum operating frequency of the semiconductor device configured in accordance with the timing parameter; changing the timing parameter of the particular macro; determining a second maximum operating frequency of the semiconductor device configured in accordance with the changed timing parameter; and determining a contribution of the selected macro to a critical timing path of the semiconductor device based on the first and second maximum operating frequencies.

Another aspect of the present invention is seen in a system for testing a semiconductor device having a plurality of macros. The system includes a tester and a controller. The tester is adapted to configure a timing parameter of a particular macro in the semiconductor device, determine a first maximum operating frequency of the semiconductor device configured in accordance with the timing parameter, change the timing parameter of the particular macro, and determine a second maximum operating frequency of the semiconductor device configured in accordance with the changed timing parameter. The controller is adapted to receive the first and second maximum operating frequencies and determine a contribution of the selected macro to a critical timing path of the semiconductor device based on the first and second maximum operating frequencies.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
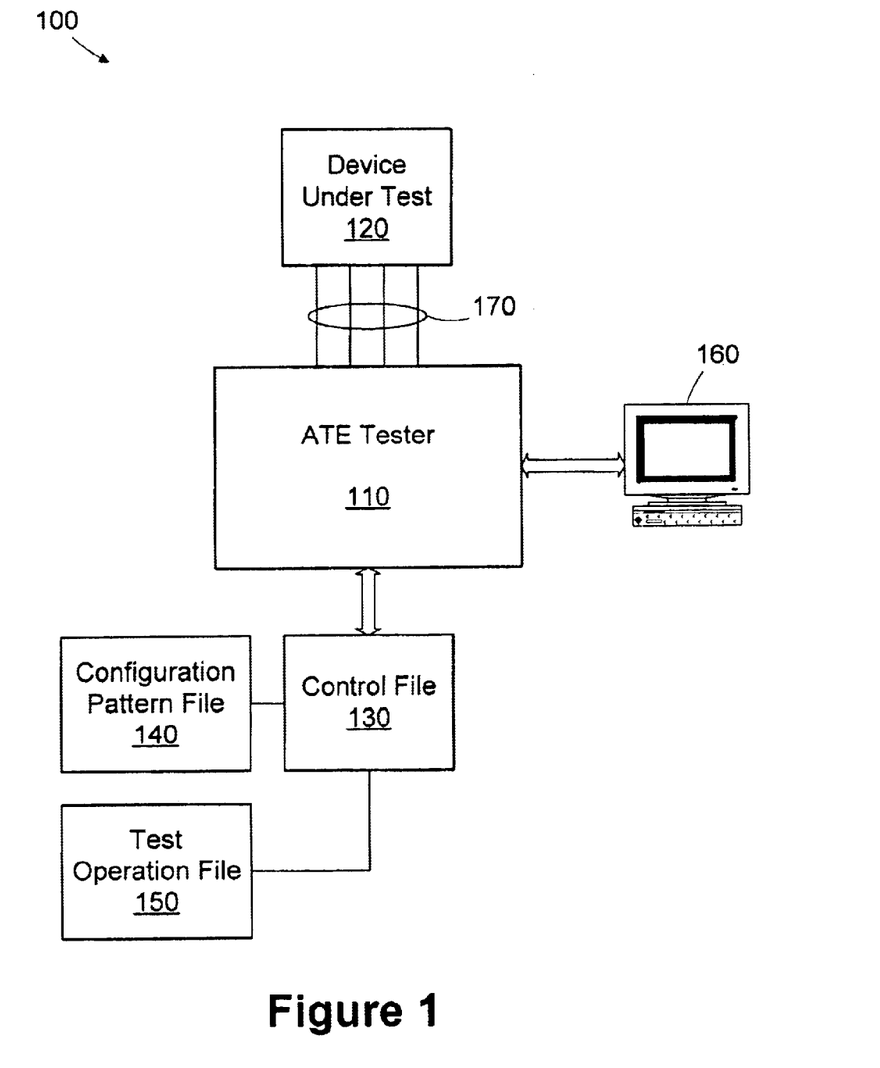
FIG. 1 is a simplified block diagram of a testing system in accordance with one illustrative embodiment of the present invention.

Turning now to the drawings, and first to FIG. 1, a simplified block diagram of a testing system 100 in accordance with one illustrative embodiment of the present invention is provided. The testing system includes an automatic test equipment integrated circuit tester (ATE tester) 110 for applying configuration and test signals to a device under test 120, such as a microprocessor. The ATE tester 110 executes a control file 130, which contains program instructions for calling a configuration pattern file 140 for specifying the settings of the device under test 120 and a test operation file 150 for performing various functional tests on the device under test 120. One commonly used test operation is referred to as an FMAX operation. The FMAX operation runs a series of mathematical operation tests at different frequencies and determines if the device passes the tests. The output of the FMAX operation is the highest frequency that resulted in a passing test.

As will be described in greater detail below, the control file 130 includes program instructions adapted to automatically modify the configuration pattern file 140 (i.e., "on the fly") between iterative calls of the test operation file 150. In an actual implementation, the control file 130 is a collection of many control files for performing various functions, such as, but not limited to, editing the configuration pattern file 140, running the configuration pattern file 140, controlling the ATE tester 110, and performing a series of functional tests. In one embodiment, the test operation file 150 may be integrated into the control file 130.

A controller 160 (e.g., a programmable computer or other device capable of data analysis) is provided for receiving the testing results from the ATE tester 110 and analyzing the data. Depending on the specific implementation, the controller 160 may be adapted to filter the data, examine trends in the data, chart the data, etc., to facilitate automatic review or to format the data for manual review or reporting.

An exemplary testing system suitable for use as the ATE tester 110 is a J973 offered by Teradyne, Inc. In the illustrated embodiment, the program instructions present in the control file 130 and test operation file 150 that are executed by the ATE tester 110 are written using a Teradyne-specific programming language similar to the "C" programming language. The control file 130 includes instructions that call either the configuration pattern file 140 and/or the test operation file 150.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing"

or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The configuration pattern file 140 includes an arrangement of logic signals with predetermined timing relationships for placing the device under test 120 in a test mode (e.g., JTAG mode) and configuring its settings (e.g., STPC settings). The ATE tester 110 drives the signals contained in the configuration pattern file 140 on signal pins 170 of the device under test 120. The particular content of the configuration pattern file 140 and the settings it is used to define is specific to the implementation of the device under test 120. Each manufacturer typically has its own signal arrangement for entering the test mode and configuring the device under test 120. Such arrangements are well known to those of ordinary skill in the art.

The test operation file 150 includes program instructions for performing an operation test on the device under test 120. The test operation file 150 may also call a pattern file that includes an arrangement of logic signals with predetermined timing relationships. The signal patterns called by the test operation file 150 are used for performing various functional tests on the device under test 120 (e.g., mathematical operations, data transfers, etc.). Again the particular signals and their timing relationships may vary between manufacturers.

Figure 2:
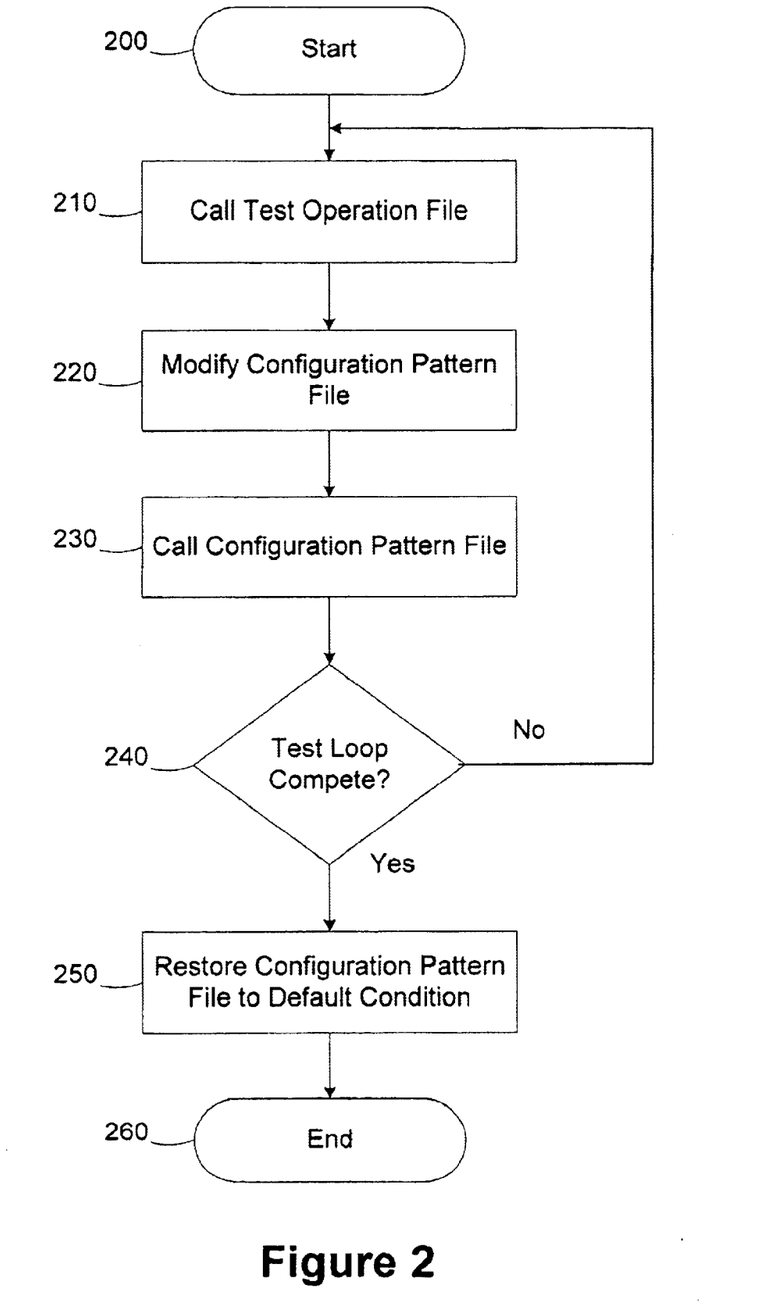
FIG. 2 is a simplified flow diagram of a method for iteratively modifying configuration pattern files for performance testing of an integrated circuit in accordance with another illustrative embodiment of the present invention.

As will be described in greater detail below, the control file 130 includes program instructions that iteratively modify the configuration pattern file 140 between instances of the test operation file 150. FIG. 2 is a simplified flow diagram of a method for iteratively modifying the configuration pattern file 140 for performance testing of the device under test 120 in accordance with another illustrative embodiment of the present invention.

The method begins in block 200. In block 210, the test operation file 150 is called. The ATE tester 110 sends the signal patterns invoked by the test operation file 150 to the device under test 120 over the signal pins 170 to perform a functional test (e.g., FMAX) of the device under test 120. In block 220, the configuration pattern file 140 is modified. In the illustrated embodiment, the signals defined in the configuration pattern file 140, when invoked, place the device under test 120 into JTAG mode and transfer setting information to its internal JTAG registers, thus configuring the device under test 120. In block 230, the configuration pattern file 140 is invoked. The ATE tester 110 sends the signals defined in the configuration pattern file 140 to the device under test 120 over the signal pins 170.

In block 240, the status of the testing loop is determined. The loop defines a series of repetitive tests that are performed with variations in the configuration of the device under test 120 (i.e., based on the modifications of the configuration pattern file 140). If the loop has been completed in block 240, the configuration pattern file default condition is restored in block 250, and the method terminates in block 260. Otherwise, the method returns to block 210 to continue the iterative testing loop.

An exemplary technique for modifying the configuration pattern file 140 is now described in greater detail. During the initialization of the ATE tester 110, the various signal patterns (e.g., 140) defined for the device under test 120 are loaded into a memory of the ATE tester 110. The individual patterns are designated by name. A particular signal pattern is invoked or accessed based on its assigned name. In JTAG mode, the ATE tester 110 typically uses only a small subset of the signal pins 170 (e.g., 5) for communication with device under test 120. The data sent to the device under test 120 is sent over a designated data pin (i.e., TDI pin) in a serial fashion. Accordingly, the configuration pattern file 140 represents a serial data stream that is sent to the device under test 120. Within the serial data stream, individual bits represent the settings that are loaded into the device under test 120 for configuration. Individual bits in the configuration pattern file 140 may be referenced based on the unique name of the configuration pattern file 140 and an offset value. An exemplary command in the Teradyne programming language for reading the bits of the serial data stream associated with a particular setting is:

$$\text{readsys(vecpin\_char, Result, all\_pins, Base, Offset, TT\_VEC\_LVM\_ONLY),} \qquad (1)$$

where vecpin_char designates the type of readsys command (i.e., pin data); Result is a data structure for holding the results of the readsys command; all_pins designates that the values for all of the pins are to be loaded into the Results structure; Base is a variable corresponding to the unique name of the configuration pattern file 140; Offset is an offset value for the particular bits that define the setting of interest; and TT_VEC_LVM_ONLY is a variable type (i.e., defined by the Teradyne testing system).

An exemplary command in the Teradyne programming language for writing over the bits in the serial data stream to change a particular setting is:

$$\text{writesys(vecpin\_char, Result, tdi, Base, Offset, TT\_VEC\_LVM\_ONLY),} \qquad (2)$$

where tdi designates the data pin.

For a particular testing loop, the control file 130 may be adapted to define a register for holding the bits associated with a particular setting. The current configuration may be determined using a readsys command (e.g., Equation 1). Within the testing loop, the control file 130 may change the value in the setting register and use a writesys command (e.g., Equation 2) to overwrite the setting bits in the configuration pattern file 140.

Although the invention is described as it may be implemented by writing over the configuration pattern file 140 stored in the memory of the ATE tester 110, it may also be implemented by writing over the configuration pattern file 140 stored on a program storage device, such as a disk drive.

Figure 3:
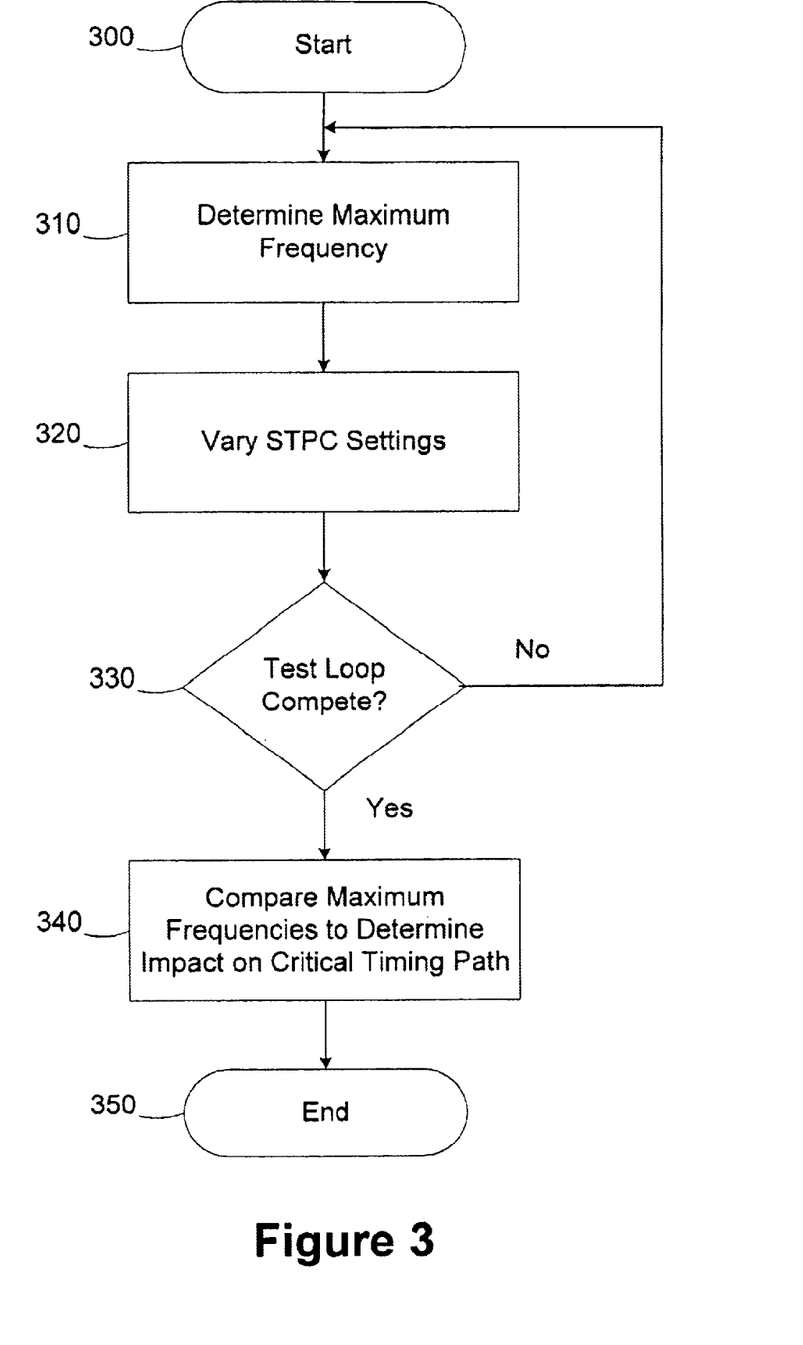
FIG. 3 is a simplified flow diagram of a method for determining critical timing path sensitivities of macros in a semiconductor device in accordance with yet another illustrative embodiment of the present invention.

The operation of the testing system 100 is now described as it may be employed to vary the self-timed pulse control (STPC) settings of the device under test 120 to perform critical timing path analysis in accordance with another embodiment of the present invention. FIG. 3, is a simplified flow diagram of a method for determining critical timing path sensitivities of macros in the device under test 120 device under test.

The STPC settings are defined in one portion of the configuration pattern file 140. For example, if the device under test 120 includes 15 macros with configurable STPC settings, the serial data stream defined in the configuration pattern file 140 includes 15 fields, one for each of the macros. The number of bits in each field depends on the possible number of STPC settings for the associated macro.

If a macro has 4 settings, its STPC field includes 2 bits. Likewise, if a macro has 8 possible STPC settings, its STPC field includes 3 bits. Each macro has a default timing path designated by an STPC setting of zero. The other STPC paths will be delayed with respect to the default path (i.e., designated by a positive STPC offset in picoseconds) or advanced with respect to the default path (negative STPC offset).

The test loop implemented by the control file 130 modifies the STPC settings for a selected macro and calls the FMAX function to determine the maximum operating frequency of the device under test 120 so configured. In the illustrated embodiment, the control file 130 varies the Offset and Result parameters in a writesys command to implement the changes to the STPC settings for the selected macro.

Determining the maximum frequency for various STPC settings allows the timing sensitivity of the selected macro to be determined. If the maximum frequency of the device under test 120 varies with the STPC setting of the selected macro, the macro contributes to the critical timing path of the device under test 120. The magnitude of the change to the maximum frequency in response to the STPC setting changes determines the relative contribution of the selected macro to the critical timing path. Conversely, if the maximum frequency of the device under test 120 does not vary significantly with the STPC setting of the selected macro, the timing of the macro may not have much direct effect on the critical timing path of the device under test 120. The STPC timing tests may also be performed under different operating conditions, such as voltage. Varying the voltage allows both timing and voltage sensitivities to be measured.

The method of FIG. 3 starts in block 300. In block 310, the maximum frequency of the device under test 120 is determined. In block 320, the STPC settings are varied. In block 330 the status of the test loop is determined (i.e., have all the STPC settings for the selected macro has been tested). If the loop has not been completed, the method transitions back to block 310 to repeat the frequency test with the new STPC settings. On the final iteration, the STPC settings are restored to the default settings (e.g., STPC 0 setting) in block 320. In block 340, the maximum frequencies of the device under test 120 for each of the various STPC settings are compared (e.g., by the controller 160) to determine the impact of the macro on the critical timing path of the device under test 120. Table 1 below illustrates timing analysis results for two exemplary macros under various STPC setting and operating voltage conditions.

TABLE 1

| Macro | STPC | 1.8 V | 1.9 V | 2.0 V |
|---|---|---|---|---|
| 1 | −63 | 461.64 | 486.52 | 509.78 |
| 1 | −46 | 459.83 | 483.52 | 505.38 |
| 1 | −39 | 458.04 | 482.52 | 504.30 |
| 1 | 0 | 451.86 | 475.68 | 497.88 |
| 1 | 69 | 426.41 | 449.27 | 470.90 |
| 1 | 86 | 424.86 | 447.55 | 468.09 |
| 1 | 93 | 423.33 | 446.70 | 467.15 |
| 1 | 156 | 414.36 | 435.91 | 456.25 |
| 2 | −64 | 451.86 | 475.68 | 496.76 |
| 2 | −47 | 451.86 | 475.68 | 497.88 |
| 2 | −39 | 451.86 | 475.68 | 497.88 |
| 2 | 0 | 451.86 | 475.68 | 497.88 |
| 2 | 79 | 451.86 | 475.68 | 497.88 |
| 2 | 98 | 450.93 | 475.68 | 497.88 |
| 2 | 108 | 450.93 | 475.68 | 497.88 |
| 2 | 169 | 450.04 | 475.68 | 497.88 |

TABLE 1-continued

| Macro | STPC | 2.1 V | 2.2 V | 2.3 V | 2.4 V |
|---|---|---|---|---|---|
| 1 | −63 | 530.52 | 549.14 | 560.96 | 571.89 |
| 1 | −46 | 526.95 | 545.31 | 559.62 | 570.50 |
| 1 | −39 | 525.77 | 545.31 | 559.62 | 571.89 |
| 1 | 0 | 518.79 | 536.59 | 554.33 | 569.12 |
| 1 | 69 | 489.57 | 507.57 | 524.59 | 539.05 |
| 1 | 86 | 486.52 | 504.30 | 521.10 | 535.36 |
| 1 | 93 | 486.52 | 503.22 | 519.94 | 534.14 |
| 1 | 156 | 474.71 | 492.65 | 507.57 | 522.26 |
| 2 | −64 | 518.79 | 536.59 | 554.33 | 568.50 |
| 2 | −47 | 518.79 | 536.59 | 554.33 | 568.50 |
| 2 | −39 | 518.79 | 536.59 | 554.33 | 568.50 |
| 2 | 0 | 518.79 | 536.59 | 554.33 | 569.12 |
| 2 | 79 | 518.79 | 536.59 | 554.33 | 569.12 |
| 2 | 98 | 518.79 | 536.59 | 554.33 | 569.12 |
| 2 | 108 | 517.94 | 536.59 | 554.33 | 569.12 |
| 2 | 169 | 518.79 | 537.44 | 554.33 | 569.12 |

Figure 4:
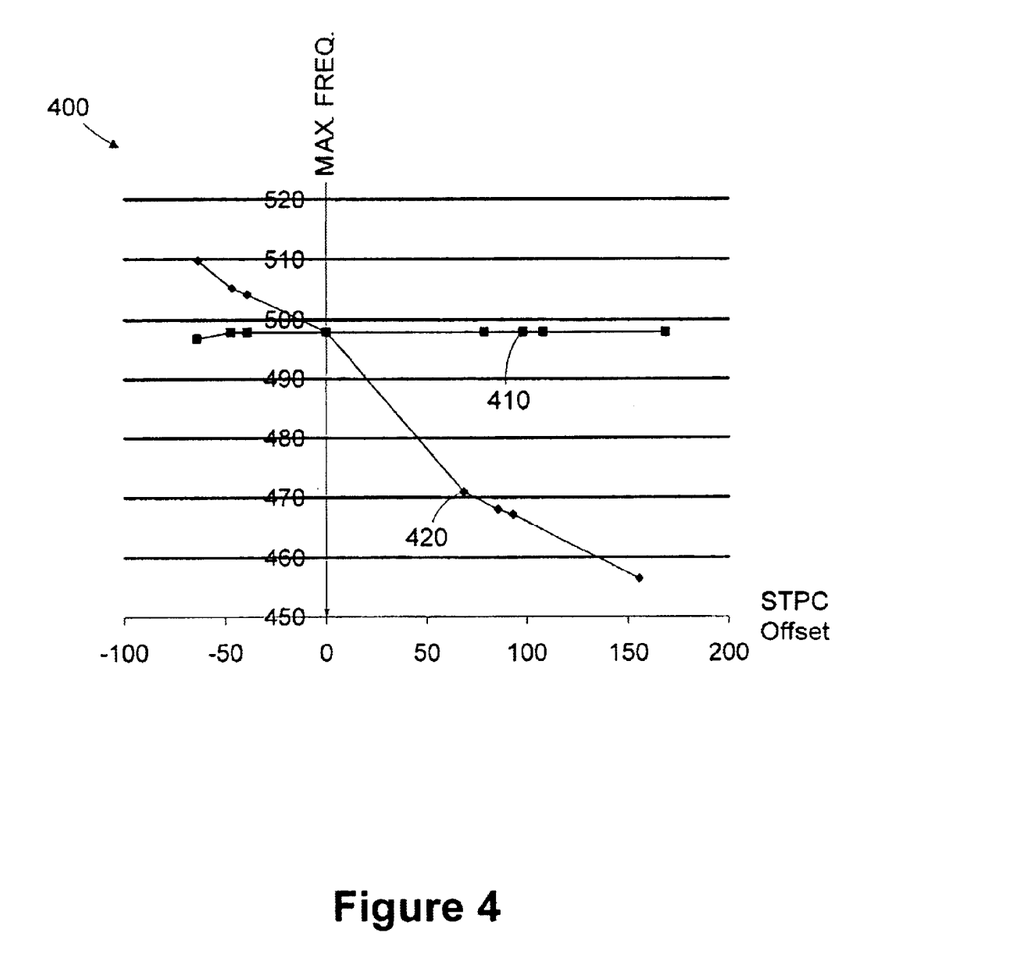
FIG. 4 is a graph illustrating performance data gathered through the method of FIG. 3.

Referring briefly to FIG. 4, a graph 400 illustrating performance data gathered through the method of FIG. 3 is provided. The timing sensitivity for Macro 1 (i.e., operating voltage of 2.0 volts) is shown by a curve 410, and the timing sensitivity for Macro 2 (i.e., operating voltage of 2.0 volts) is shown by a curve 420. The curve 410 demonstrates that Macro 1 has little contribution to the critical timing path of the device under test 120. However, the curve 420 illustrates that Macro 2 has a significant effect on the critical timing path of the device under test 120. As discussed above with reference to FIG. 3, the vertical axis of the graph 400 indicates a maximum frequency and the horizontal axis indicates an STPC offset.

Figure 5:
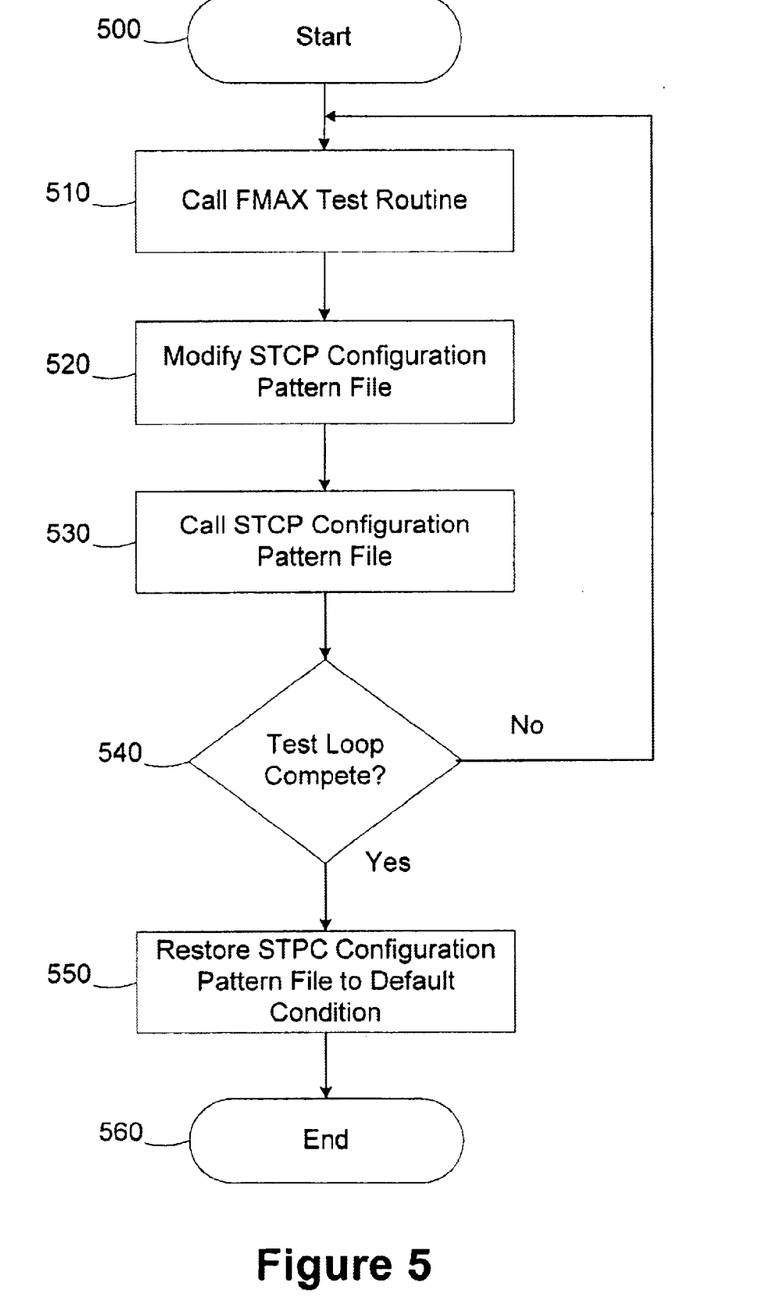
FIG. 5 is a simplified flow diagram of a method for iteratively modifying configuration pattern files used in the system of FIG. 1 to implement the method of FIG. 3.

Turning now to FIG. 5, a simplified flow diagram of a method for iteratively modifying configuration pattern files used in the system of FIG. 1 to implement the method of FIG. 3 is provided. The method begins in block 500. In block 510, the control file 130 invokes the FMAX test routine (i.e., the test operation file 150) to determine the maximum operating frequency of the device under test 120 configured with the current STPC settings. In block 520, the configuration pattern file 140 including the STPC settings is modified to change the STPC settings for the selected macro. The STPC settings may be changed using a writesys command to change the particular bits in the data stream associated with the STPC settings for the selected macro. In block 530, the configuration pattern file 140 including the STPC settings is invoked. The ATE tester 110 sends the signals defined in the configuration pattern file 140 to the device under test 120 over the signal pins 170. The STPC configuration data is sent in a serial stream over the TDI pin. The signals defined in the configuration pattern file 140 place the device under test 120 into JTAG mode and transfer setting information to its internal JTAG registers, thus configuring the STPC setting of a selected macro in the device under test 120.

In block 540, the status of the testing loop is examined to determine if all of the STPC settings for the selected macro have been tested. If the loop has been completed in block 540, the configuration pattern file 140 is modified to restore the default STPC settings in block 550, and the method terminates in block 560. Otherwise, the method returns to block 510 to continue the iterative testing routine.

In response to determining the impact of a selected macro on the critical timing path of the device under test 120, various actions may be taken. Design improvements may be targeted at those macros that have the greatest impact on the critical timing path. Default STPC settings (i.e., zero settings) may be re-centered based on the timing analysis. Those macros that have additional margin may be timed more aggressively, thus increasing the expected operating speeds of the design. Those macros with less margin may be timed less aggressively to increase the robustness of the design.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for determining critical timing path sensitivities of macros in a semiconductor device, comprising:
   accessing a first file including information indicative of at least one test operation;
   configuring a timing parameter of a particular macro in the semiconductor device based on the information included in the first file;
   determining a first maximum operating frequency of the semiconductor device configured in accordance with the timing parameter;
   modifying a second file including information indicative of a configuration of the semiconductor device;
   changing the timing parameter of the particular macro;
   determining a second maximum operating frequency of the semiconductor device configured in accordance with the changed timing parameter and the second file; and
   determining a contribution of the selected macro to a critical timing path of the semiconductor device based on the first and second maximum operating frequencies.

2. The method of claim 1, wherein configuring the timing parameter further comprises configuring a self-timed pulse control (STPC) parameter of the selected macro.

3. The method of claim 2, wherein changing the timing parameters further comprises decreasing the STPC parameter.

4. The method of claim 3, wherein determining the contribution of the selected macro to the critical timing path of the semiconductor device further comprises determining that the selected macro has a positive effect on the critical timing path in response to the second maximum operating frequency being greater than the first maximum operating frequency.

5. The method of claim 2, wherein changing the timing parameter further comprises increasing the STPC parameter.

6. The method of claim 5, wherein determining the contribution of the selected macro to the critical timing path of the semiconductor device further comprises determining that the selected macro has a positive effect on the critical timing path in response to the second maximum operating frequency being less than the first maximum operating frequency.

7. The method of claim 1, wherein determining the contribution of the selected macro to the critical timing path of the semiconductor device further comprises determining that the selected macro has a limited effect on the critical timing path in response to the second maximum operating frequency being substantially the same as the first maximum operating frequency.

8. The method of claim 1, further comprising changing a default STPC setting of the selected macro based on the first and second maximum operating frequencies.

9. The method of claim 1, wherein modifying the second file comprises modifying the second file to modify information indicative of a JTAG mode of the semiconductor device.

10. The method of claim 9, further comprising placing the semiconductor device into JTAG mode based on the information indicative of the JTAG mode.

11. The method of claim 10, wherein placing the semiconductor device into JTAG mode comprises providing the information indicative of the JTAG mode to a JTAG register in the semiconductor device.

12. A system for testing a semiconductor device including a plurality of macros, comprising:
    a tester configured to access a first file including information indicative of at least one test operation, configure a timing parameter of a particular macro in the semiconductor device based on the information in the first file, determine a first maximum operating frequency of the semiconductor device configured in accordance with the timing parameter, modify a second file including information indicative of a configuration of the semiconductor device, change the timing parameter of the particular macro, and determine a second maximum operating frequency of the semiconductor device configured in accordance with the changed timing parameter and the second file; and
    a controller configured to receive the first and second maximum operating frequencies and determine a contribution of the selected macro to a critical timing path of the semiconductor device based on the first and second maximum operating frequencies.

13. The system of claim 12, wherein the timing parameter further comprises a self-timed pulse control (STPC) parameter of the selected macro.

14. The system of claim 13, wherein the tester is adapted to decrease the STPC parameter.

15. The system of claim 14, wherein the controller is adapted to indicate that the selected macro has a positive effect on the critical timing path in response to the second maximum operating frequency being greater than the first maximum operating frequency.

16. The system of claim 13, wherein the tester is adapted to increase the STPC parameter.

17. The system of claim 16, wherein the controller is adapted to indicate that the selected macro has a positive effect on the critical timing path in response to the second maximum operating frequency being less than the first maximum operating frequency.

18. The system of claim 12, wherein the controller is adapted to indicate that the selected macro has a reduced effect on the critical timing path in response to the second maximum operating frequency being substantially the same as the first maximum operating frequency.

19. A system determining critical timing path sensitivities of macros in a semiconductor device, comprising:
    means for accessing a first file including information indicative of at least one test operation;
    means for configuring a timing parameter of a particular macro in the semiconductor device based on the information included in the first file;
    means for determining a first maximum operating frequency of the semiconductor device configured in accordance with the timing parameter;
    means for modifying a second file including information indicative of a configuration of the semiconductor device;

means for changing the timing parameter of the particular macro;

means for determining a second maximum operating frequency of the semiconductor device configured in accordance with the changed timing parameter and the second file; and means for determining a contribution of the selected macro to a critical timing path of the semiconductor device based on the first and second maximum operating frequencies.

* * * * *